United States Patent [19]
White

[11] Patent Number: 5,252,365
[45] Date of Patent: Oct. 12, 1993

[54] METHOD FOR STABILIZATION AND LUBRICATION OF ELASTOMERS

[75] Inventor: Gerald W. White, Dallas, Tex.

[73] Assignee: White Engineering Corporation, Dallas, Tex.

[21] Appl. No.: 826,898

[22] Filed: Jan. 28, 1992

[51] Int. Cl.$^5$ .................. B05D 3/06; C23C 16/00; B23H 3/00

[52] U.S. Cl. .................... 427/525; 427/531; 427/530; 427/561; 427/566; 427/250; 427/252; 427/528; 204/192.14; 204/192.16

[58] Field of Search ........... 427/525, 528, 530, 531, 427/561, 566, 597, 250, 251, 252, 253; 204/192.14, 192.15, 192.16

[56] References Cited

U.S. PATENT DOCUMENTS

| | | | |
|---|---|---|---|
| Re. 30,401 | 9/1980 | Whie | 204/192 N |
| 859,813 | 7/1907 | Hartmann | |
| 889,807 | 6/1908 | Reynolds | |
| 1,635,482 | 7/1927 | Joyce | |
| 2,164,764 | 7/1939 | Claypoole | 204/8 |
| 2,967,805 | 1/1961 | Forestek | 204/20 |
| 3,992,164 | 11/1976 | Fengler | 427/251 |
| 4,016,505 | 4/1977 | Wakabuzaski et al. | 427/525 |
| 4,054,426 | 10/1977 | White | 427/531 |
| 4,131,530 | 12/1978 | Blum et al. | 204/192.14 |
| 4,388,164 | 6/1983 | Moll et al. | 204/192.14 |
| 4,420,386 | 12/1983 | White | 204/192 N |
| 4,466,874 | 8/1984 | Belke, Jr. et al. | 204/192.14 |
| 4,468,309 | 8/1984 | White | 204/192 N |
| 4,863,808 | 9/1989 | Sallo | 204/192.14 |
| 4,886,681 | 12/1989 | Clubes et al. | 427/525 |
| 4,917,963 | 4/1990 | Kittler | 204/192.14 |
| 4,934,254 | 6/1990 | Clark et al. | 427/253 |
| 4,950,499 | 8/1990 | Martin et al. | 427/250 |

FOREIGN PATENT DOCUMENTS 8218040 12/1983 Japan .................. 427/52.5

*Primary Examiner*—Marianne Padgett
*Attorney, Agent, or Firm*—Ross, Howison, Clapp & Korn

[57] ABSTRACT

A method for stabilizing and lubricating elastomeric material includes depositing a first material film layer of carbide forming material by high energy level vacuum plating onto the elastomeric material to thereby stabilize free carbon atoms present in the elastomeric material. A second material film layer is deposited by high energy vacuum plating onto the first material film layer to thereby lubricate the elastomeric material.

12 Claims, 1 Drawing Sheet

METHOD FOR STABILIZATION AND LUBRICATION OF ELASTOMERS

TECHNICAL FIELD OF THE INVENTION

This invention relates to elastomers, and more particularly to protecting elastomeric compounds from chemical and physical decay while providing inherent surface lubricity utilizing high energy level ion plating methods.

BACKGROUND OF THE INVENTION

Elastomers, such as, for example, seals and O-rings have long been known for their inherent resiliency. This resiliency permits these structural members to be used to effectively seal an opening between adjacent parts since these elastomers can be compressed within the space to form a sealing barrier. Thus, in the case of sealing a shaft, for example, with respect to a relatively rotatable surrounding housing, it has been common practice to provide an O-ring in the space between the shaft and the housing to effectuate an efficient seal in this area. Similarly, flat or disc types of washers normally used in valve members, utilize the inherent resiliency of the washer to effectuate the sealing action.

Another important characteristic of elastomers is the tendency of elastomeric seals to exhibit high values of sliding friction when installed under compression. One such use of an elastomer is in an oil well stuffing box. The stuffing box in used on pumping oil wells in conjunction with a through passing polished rod to effect pumping while maintaining a sliding seal to protect the environment from both liquid and gas emissions from the well production steam in the tubing below ground. Elastomers used in oil well stuffing boxes have not been totally successful in their intended function, and their failure has contributed to a major source of environmental pollution. The friction inherent in the elastomers themselves leads to flexural stresses and eventually to the elastomer breakdown, as it seems that there is a practical limit to the applied compression at installation beyond which the frictional drag of the rubber on the polished rod will result in heating sufficient to actually burn the seals and damage the polished rod. It is even possible to support the entire sucker rod string dead weight by tightening the seals. Thus, a seal installed with sufficient compression to actually effect the intended seal will fail due to friction whereas a relaxation of compression to allow operation will leak effluent to the environment.

While many elastomers may operate satisfactory under normal conditions, it has been found that the efficiency and life thereof are unfavorably affected when these elastomers are subjected to certain adverse types of conditions that frequently occur in industrial use. Thus, for example, where the rubber sealing member is subjected to a high temperature, the major constituents of the seal may decompose to a fluid state or chemically break down to release volatile substances, thereby rendering the sealing unit useless. Most elastomers are by nature, liquids, with a normal tendency to return to the liquid state. The elastomers are restrained from returning to this liquid state by cross linking bonds between the polymeric chains. In actual use, as a result of stress, chemical and thermal effects, the cross linking bonds degenerate and, in the breakdown process, will offer reactive carbon atoms to the surroundings. This carbon reacting with metals in a seal bore forms metal carbide residue on the contacting metal.

Additional problems associated with the use of elastomers as sealing structure result if the sealing member is subjected to a corrosive action, wherein the body portion will be eroded or corroded to a point where the member will not be able to effectuate a satisfactory seal. Other extreme conditions that result in premature deterioration of the sealing member or inefficiency thereof, include pressure extremes and subjection to certain compounds and gases that operate to decompose or dissolve the body portion of the elastomer. Similarly, when exposed to low temperatures the inherent resiliency of an elastomer is lost due to embrittlement occurring, with actual fracture frequently occurring.

Various methods have been proposed to protect elastomers and/or enhance their function by various wet chemistry metal plating methods. However, these methods have been unsuccessful due to the lack of adhesion of the metal/elastomer interface. Flexure, particularly in dynamic seals, will typically cause the elastomer to tear through the thin metal shells in a short period of time. Plating voids and/or stress cracks permit the elements of the working environment to enter the pure elastomer and a normal failure progression will occur. The very presence of shattered film particles can lead to the formation of a leak site.

Therefore, to be effective and of lasting value, an applied metal film must intimately conform to the surface topography of the elastomer. The applied metal film must also react in response to flexure and/or compression of the elastomer. To achieve these results, the film must be atomically bonded at the molecular level, and the value of adhesive strength must be in excess of 2,000 psi. Normal wet chemistry plating methods have failed to achieve this result.

A need has thus arisen for an elastomer and method for stabilization and lubrication which will result in a stable as well as lubricated elastomer that will ensure that the lubricant is not displaced by adhesion failure when the stresses inherent in the elastomer's operation are experienced.

SUMMARY OF THE INVENTION

In accordance with the present invention, a method for stabilizing and lubricating elastomeric material is provided. The method includes depositing a first material film layer of carbide forming material by high energy level vacuum plating onto the elastomeric material to thereby stabilize free carbon atoms present in the elastomeric material. A second material film layer is deposited by high energy vacuum plating onto the first material film layer to thereby lubricate the elastomeric material.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
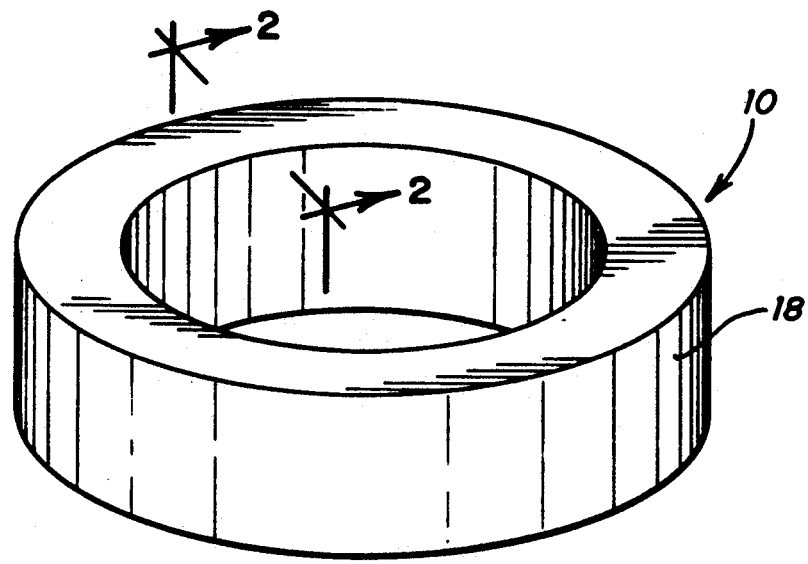
FIG. 1 is a perspective view of an elastomer in accordance with the present invention.
Figure 2:
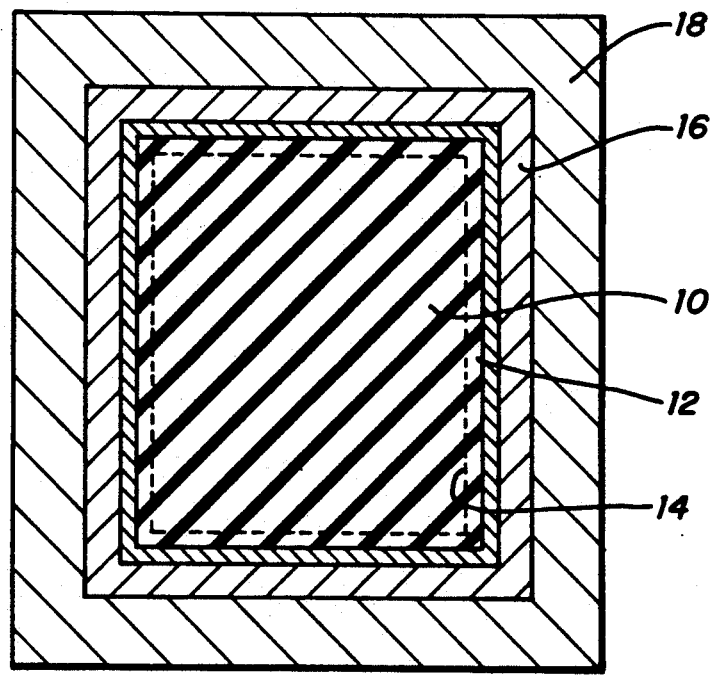
FIG. 2 is an enlarged sectional view taken generally along sectional lines 2—2 of FIG. 1 which has been plated in accordance with the present invention.

Referring simultaneously to FIGS. 1 and 2, an elastomer, such as, for example, an O-ring, is generally identified by the numeral 10. While the present invention is useful for coating elastomers, such as an O-ring 10, the present method for stabilization and lubrication of elastomers is not limited to O-rings. The present elastomer and method is useful for coating various types of elastomers, such as, for example, stuffing box rubbers, O-rings, washers, chevron seals and the like.

In accordance with the present invention, a first material film layer is deposited onto elastomer 10 for stabilization of free carbon atoms within elastomer 10. A material film layer 12 of ready carbide forming metal such as, for example, iron, chromium or titanium, is deposited on elastomer 10. At the onset of a deposition, the initial ions arrive under an electrical charge acceleration and lodge into the substrate lattice structure 14 below the surface of elastomer 10. As the buildup continues, a thin film or layer 12 is deposited. As elastomer 10 is used, and as the free carbon atoms develop, these carbon atoms are in an instantaneous capture mode by the intimately contacting metal atoms of layer 12. Layer 12 thereby prevents and avoids the reaction of these free carbon atoms with metals in the surrounding environment. A direct and immediate result of the use of layer 12 is that by the carbide conversion, the elastomer 10 outer surface becomes more durable. Material film layer 12 is deposited to a thickness of about 2,000 angstroms.

A second material film layer 16 may then be deposited on material film layer 12 as an encapsulating film to contain stray carbon atoms. Material film layer 16 may comprise for example, nickel which has a low solubility for carbon and therefore can serve as an effective migration barrier. Since nickel carbide does not exist in the solid state, it only occurs in the liquid and vapor state at high temperatures, the nickel material film layer 16 further operates to stabilize elastomer 10. Material film layer 16 may also be deposited to a thickness of about 2,000 angstroms.

Applied to material film layer 16 or, if material film layer 16 is not utilized, applied directly onto material film layer 14, is a material film layer 18 which functions as a lubricating material for elastomer 10. Material film layer 18 may comprise, for example, materials including gold, copper, tin, silver, indium, alloys such as silver-palladium, tin-silver, copper-nickel, as well as brass and bronze. These materials have properties of low friction, good adhesion and low shear stress and may be deposited by high level ion plating in a thin film. The thickness of material film layer 18 may be approximately 8,000 to 10,000 angstroms thick.

The total thickness of material film layers 12, 16, and 18 thereby result in a thickness of approximately 10,000 to 12,000 angstroms depending upon whether material film layer 16 is utilized. At this thickness level, the material films deposited adhere fully and respond totally to the flexure of elastomer 10.

The material film layers in accordance with the present invention are applied by several different processes such as, for example, chemical vapor deposition, vacuum evaporation also referred to as physical vapor depositions, sputtering including radio frequency, direct current and various magnitron versions as well as ion plating. Such processes are described in U.S. Pat. Nos. Re. 30,401; 4,420,386; and 4,468,309 which descriptions, disclosures, and drawings are hereby incorporated by reference into the present specification.

It therefore can be seen that the present elastomer and method for stabilization and lubrication in which material film layers are deposited onto the elastomer using high particulate energy level ion plating processes results in an improved elastomeric seal for use in any instance where leakage to the environment is occurring as a result of a need for tight compression in elastomeric seals. The ability of the material film layers to adhere fully and respond to the flexure of the elastomer prevents cracking and separation of the material film layers from the elastomer. The stabilization of free carbon atoms within the outer surface of the elastomer prevents and avoids the reaction of these atoms with metals in the surrounding assembly.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A method for stabilizing and lubricating elastomeric material having a characteristic of producing free carbon atoms as the elastomeric material degrades over time, such that carbon atoms are severed from polymer chains, the method comprising the steps of:
   depositing a first material film layer of carbide forming material by vacuum plating onto the elastomeric material to thereby stabilize the free carbon atoms present in the elastomeric material; and
   depositing a second material film layer by high energy level vacuum plating onto the first material film layer to thereby lubricate the elastomeric material.

2. The method of claim 1 wherein the first and second material film layers are deposited to a total thickness of about 10,000 angstroms on the elastomeric material.

3. The method of claim 1 wherein the first and second material film layers are deposited by ion plating.

4. The method of claim 1 wherein the first and second material film layers are deposited by sputtering.

5. The method of claim 1 wherein the first and second material film layers are deposited by vacuum evaporation.

6. The method of claim 1 wherein the first and second material film layers are deposited by chemical vapor deposition.

7. A method for stabilizing and lubricating elastomeric material having a characteristic of producing free carbon atoms as the elastomeric material degrades over time, such that carbon atoms are severed from polymer chains, the method comprising the steps of:
   depositing a first material film layer of carbide forming material by vacuum plating onto the elastomeric material to thereby stabilize the free carbon atoms present in the elastomeric material;
   depositing a second material film layer of nickel material by vacuum plating onto the first material film layer to thereby form a migration barrier; and
   deposition a third material film layer by high energy level vacuum plating onto the second material film layer to thereby lubricate the elastomeric material.

8. The method of claim 7 wherein the first, second and third material film layers are deposited to a total thickness of about 12,000 angstroms on the elastomeric material.

9. The method of claim 7 wherein the first material film layer includes material selected from the group consisting of iron, chromium and titanium.

10. The method of claim 7 wherein the third material film layer is selected from the group consisting of gold, copper, tin, silver, indium, brass, bronze, silver-palladium alloy, tin-silver alloy, and copper-nickel alloy.

11. The method of claim 7 wherein the first material film layer includes material selected from the group consisting of iron, chromium and titanium; and the third material film layer is selected from the group consisting of gold, copper, tin, silver, indium, brass, bronze, silver-palladium alloy, tin-silver alloy, and copper-nickel alloy.

12. The method of claim 11 wherein the first, second and third material film layers are deposited to a total thickness of about 12,000 angstroms on the elastomeric material.

* * * * *